US008742373B2

(12) United States Patent
Radovanov et al.

(10) Patent No.: US 8,742,373 B2
(45) Date of Patent: Jun. 3, 2014

(54) METHOD OF IONIZATION

(75) Inventors: Svetlana Radovanov, Marblehead, MA (US); Ludovic Godet, Boston, MA (US); Christopher R. Hatem, Salisbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 203 days.

(21) Appl. No.: 12/965,419

(22) Filed: Dec. 10, 2010

(65) Prior Publication Data

US 2012/0145918 A1 Jun. 14, 2012

(51) Int. Cl.
*H01J 37/32* (2006.01)
(52) U.S. Cl.
CPC .................. *H01J 37/32412* (2013.01)
USPC ..................................... 250/492.21
(58) Field of Classification Search
USPC .................. 250/492.21, 423, 424, 492.2
See application file for complete search history.

(56) References Cited

U.S. PATENT DOCUMENTS

| | | | |
|---|---|---|---|
| 7,528,389 B2 | 5/2009 | Fang et al. | |
| 7,666,771 B2 | 2/2010 | Krull et al. | |
| 7,687,787 B2 * | 3/2010 | Godet et al. | 250/492.21 |
| 7,807,961 B2 * | 10/2010 | Hatem et al. | 250/251 |
| 7,972,947 B2 * | 7/2011 | Giles et al. | 438/528 |
| 2004/0002202 A1 | 1/2004 | Horsky et al. | |
| 2007/0178678 A1 | 8/2007 | Hatem et al. | |
| 2008/0185537 A1 * | 8/2008 | Walther et al. | 250/492.21 |
| 2008/0290425 A1 * | 11/2008 | Giles et al. | 257/408 |
| 2008/0299749 A1 | 12/2008 | Jacobson et al. | |
| 2009/0000946 A1 * | 1/2009 | Singh et al. | 204/298.01 |
| 2009/0001890 A1 | 1/2009 | Singh et al. | |
| 2009/0166554 A1 | 7/2009 | Radovanov et al. | |
| 2009/0227061 A1 | 9/2009 | Bateman et al. | |
| 2009/0243490 A1 | 10/2009 | Cho et al. | |
| 2010/0112795 A1 * | 5/2010 | Kaim et al. | 438/515 |
| 2010/0140077 A1 | 6/2010 | Koo et al. | |
| 2010/0224322 A1 * | 9/2010 | Sui et al. | 156/345.25 |
| 2011/0253902 A1 | 10/2011 | Godet et al. | |
| 2011/0309049 A1 | 12/2011 | Papasouliotis et al. | |

FOREIGN PATENT DOCUMENTS

| | | |
|---|---|---|
| WO | 2011149607 A1 | 12/2011 |
| WO | 2011156813 A1 | 12/2011 |

OTHER PUBLICATIONS

Josep Arno, "Report on in-Situ antimony fluoride generation for ion implant processes," 2002, 14th International Conference on Ion implantation Technology Proceedings, pp. 452-454, 0-7803-7155-0, IEEE.

Atsushi Suzuki & Hidehiko Nonaka, "In situ measurement of gas composition changes in radio frequency plasma using a quartz sensor,"2009, Rev. of Sci. Instr., 095109-1 to 095109-9, vol. 80, American Institute of Physics.

Nobuki Mutsukura & Kazuhiko Saitoh, "Temperature dependence of a-C:H film deposition in a CH4 radio frequency plasm," 1996, J. Vac. Sci. Tech. A, pp. 2666-2668, 14(4), American Vacuum Society.

* cited by examiner

*Primary Examiner* — Nicole Ippolito
*Assistant Examiner* — Eliza Osenbaugh-Stewar

(57) ABSTRACT

A plasma is formed from one or more gases in a plasma chamber using at least a first power and a second power. A first ion species is generated at said first power and a second ion species is generated at said second power. In one embodiment, the first ion species and second ion species are implanted into a workpiece at two different energies using at least a first bias voltage and a second bias voltage. This may enable implantation to two different depths. These ion species may be atomic ions or molecular ions. The molecular ions may be larger than the gases used to form the plasma.

16 Claims, 8 Drawing Sheets

METHOD OF IONIZATION

FIELD

This invention relates to the formation of molecular or atomic ions and, more particularly, to the formation of polyatomic ions for implantation at different energies.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Some applications require different ion species to be implanted into a workpiece to form a particular dopant profile. For example, a co-implant of two or more species may be performed to obtain a desired level of amorphization and dopant depth profile for ultra-shallow junctions (USJ). This typically requires several implant steps of individual ion species. Use of multiple implant steps may require multiple ion implanters or may decrease throughput due to increased processing time.

One way to avoid multiple implant steps is to implant a molecular ion that includes the desired ion species. Molecular ion beams may be more easily transported at a higher energy and lower beam current than atomic ion beams. The atoms (including dopant species) in a molecular ion share an overall kinetic energy of the molecular ion according to their respective atomic masses. Furthermore, by having fewer ions implanted to obtain the same dose, any space charge effect in the ion beam and, consequently, beam "blow up" may be minimized.

Use of molecular ions, however, may not implant the various species at different desired energies or depths. Molecular ions also may be difficult to form and maintain during the ionization or implantation process. Use of an indirectly heated cathode (IHC) or Bernas source tends to break up molecules into atomic ions. For example, dopant molecules like $BF_3$, $PH_3$, $PF_5$, $AsH_3$, $B_2H_6$, or $GeF_5$ tend to dissociate easily in the thermal plasmas formed using an or Bernas source. Thus, atomic ions may be formed instead of molecular ions. A plasma doping system that generates a plasma of ions and neutrals and biases a workpiece for implantation may not adequately control electron temperature or other plasma conditions such as pressure, power, frequency, or gas flow to form molecular ions. Thus, molecular ions may dissociate within a high voltage sheath of such a plasma doping system. This may be due to the electric charge and collisions inside the high voltage sheath. So, for example, $BF_3^+$ may only survive as $B^+$, $BF^+$, or $BF_2^+$ ions after crossing the high voltage sheath and implanting a workpiece. Additionally, as the molecular ions increase in molecular weight, it may become more difficult to not dissociate these molecular ions into atomic ions or smaller molecular ions in a conventional ion source. Other ion source systems may have lifetime issues due to depositions on components or walls of the ion source caused by a recombination process. Use of certain species may cause deposits of various atomic or molecular compounds to build up on surfaces within the ion source.

Accordingly, there is a need in the art for an improved method of forming ions, and, more particularly, implanting polyatomic ion species at different energies.

SUMMARY

According to a first aspect of the invention, a method to generate ions is provided. The method comprises flowing a gas into a plasma chamber. A plasma is formed from the gas in the plasma chamber using at least a first power and a second power. A first ion species is generated at the first power and a second ion species is generated at the second power. Both the first ion species and the second ion species are generated from the gas. The first ion species and second ion species are implanted into a workpiece at two different energies using at least a first bias voltage and a second bias voltage. The first bias voltage corresponds to the first power and the first ion species. The second bias voltage corresponds to the second power and the second ion species.

According to a second aspect of the invention, a method to generate molecular ions is provided. The method comprises flowing a first gas and a second gas into a plasma chamber. A plasma is formed from the first gas and the second gas in the plasma chamber. A first molecular ion and a second molecular ion are generated from the first gas and the second gas and implanted into a workpiece at two different energies.

According to a third aspect of the invention, a method to generate ions is provided. The method comprises flowing a first molecular gas into a plasma chamber. A plasma is formed from the first molecular gas in the plasma chamber with a first power and a second power. The second power is greater than the first power. A first ion and a second ion are generated from the first molecular gas. The first ion is generated at the first power and the second ion is generated at the second power. The first ion and the second ion are implanted into a workpiece.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this process are described herein in connection with a plasma doping system. However, these embodiments can be used with other systems and processes involved in semiconductor manufacturing or other systems that use implantation. For example, in an alternate embodiment, a beam-line ion implanter is used with an RF ion source. Thus, the invention is not limited to the specific embodiments described below.

Figure 1:
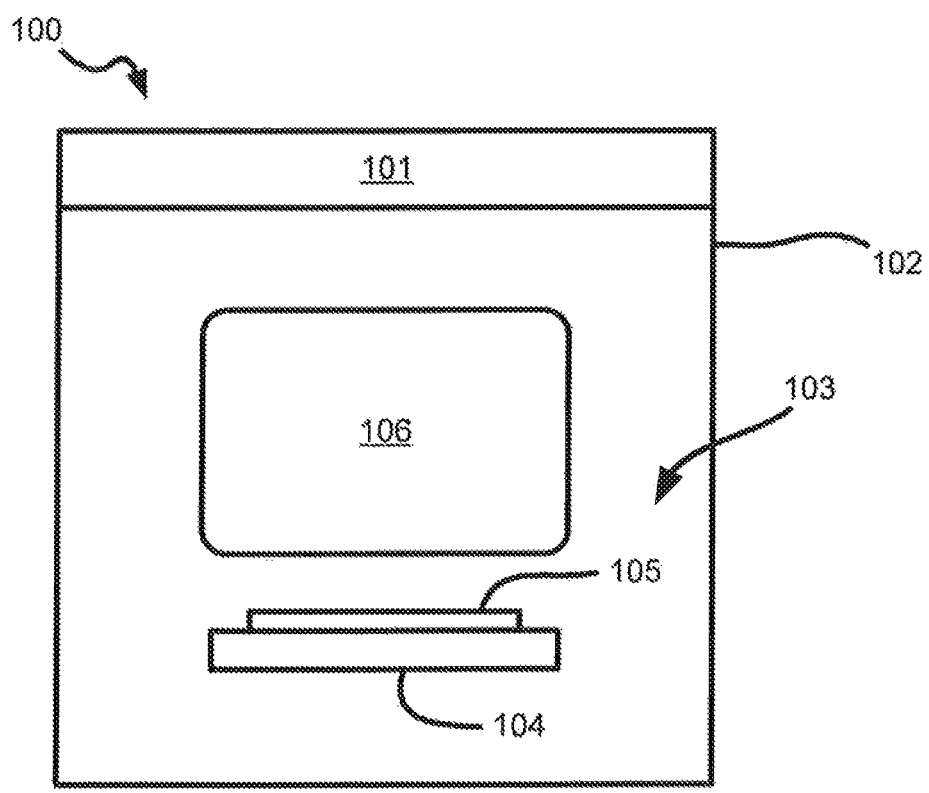
FIG. 1 is a cross-sectional view of a plasma doping system.

Turning to FIG. 1, the plasma doping system 100 includes a process chamber 102 defining an enclosed volume 103. The process chamber 102 or workpiece 105 may be cooled or heated by a temperature regulation system, such as within a load lock or using a pre-chiller. A platen 104 may be positioned in the process chamber 102 to support a workpiece 105. The platen 104 also may be cooled or heated by a temperature regulation system. Thus, the plasma doping system 100 may incorporate hot or cold implantation of ions in some embodiments. In one instance, the workpiece 105 may be a semiconductor wafer having a disk shape, such as, in one embodiment, a 300 mm diameter silicon wafer. However, the workpiece 105 is not limited to a silicon wafer and may be a flat panel, solar cell, light emitting diode (LED), compound semiconductor, glass substrate, polymer substrate, or other workpiece. The workpiece 105 may be clamped to a flat surface of the platen 104 by electrostatic or mechanical forces. In one embodiment, the platen 104 may include conductive pins for making connection to the workpiece 105.

The plasma doping system 100 further includes a source 101 configured to generate a plasma 106 from an implant gas within the process chamber 102. The source 101 may be an RE source or other sources known to those skilled in the art. In one instance, an RF source with at least one coil around the process chamber 102 is used. This RF source may be coupled to a matching network and RF generator.

The platen 104 may be biased. This bias may be provided by a DC or RF power supply. The plasma doping system 100 may further include a shield ring, a Faraday sensor, or other components. In some embodiments, the plasma doping system 100 is part of a cluster tool, or operatively-linked process chambers 102 within a single plasma doping system 100. Thus, numerous process chambers 102 may be linked in vacuum.

During operation, the source 101 is configured to generate the plasma 106 within the process chamber 102. In one embodiment, the source 101 is an RF source that resonates RF currents in at least one RF antenna to produce an oscillating magnetic field. The oscillating magnetic field induces RF currents in the process chamber 102. The RF currents in the process chamber 102 excite and ionize the implant gas to generate the plasma 106. The bias provided to the platen 104 and, hence, the workpiece 105 will accelerate ions from the plasma 106 toward the workpiece 105 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Figure 2:
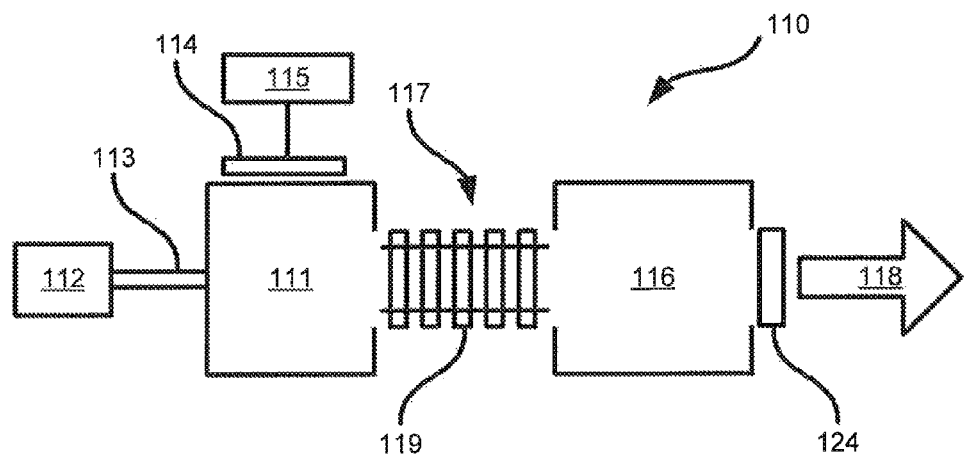
FIG. 2 is a block diagram of an ion source.

FIG. 2 is a block diagram of an ion source. The ion source 110, which may correspond to an ion source in a beam-line ion implanter, includes a first ion source 111. This first ion source 111 has a gas source 112 connected by a gas feed 113. The first ion source 111 may be, for example, an RF or DC pulsed ion source and may produce molecular or atomic ions. An antenna 114 resonates RF or DC currents from the power source 115. In one instance, the antenna 114 is attached to an RF matching network. The power supply 115 may be either an RF or DC power supply. This produces as oscillating magnetic field that induces RF or DC currents within the first ion source 111. In one particular embodiment, the first ion source 111 is a multi-set point RF ion source. A multi-set point RF (MSPRF) ion source enables RF power to be modulated as a function of time. Such an RF source may be coupled to a power supply that can pulse. RF frequency, power, or duty cycle may be modified using such an ion source. The first ion source 111 in an alternate embodiment may have an immersed RF antenna or may be an electron cyclotron resonance (ECR) or microwave ion source.

Ions formed in the first ion source 111 are transported to a second chamber 116 using a plasma pipe 117. The plasma pipe 117 has a plurality of ring magnets 119 that may form a multi-cusp arrangement to provide optimal plasma or ion confinement. In an alternate embodiment, the plasma pipe 117 uses solenoids. Extraction optics may be located between the first ion source 111 and the plasma pipe 117 or between the plasma pipe 117 and the second chamber 116 to extract the ions.

The second chamber 116 may be a diffusion chamber or an arc chamber. This arc chamber may be part of an existing ion implanter and may contain, for example, an IHC or Bernas ion source. This arc chamber may or may not be operating while the ions are transported to the second chamber 116 from the first ion source 111. The ions 118 are then extracted from the second chamber 116. These ions 118 may be part of an ion beam in one embodiment. This extraction may use extraction optics 124. The ions 118 may or may not be subsequently mass analyzed. Thus, the ion source 110 may be used in plasma doping, plasma immersion, flood implant, or sheath modulation tools.

Figure 3:
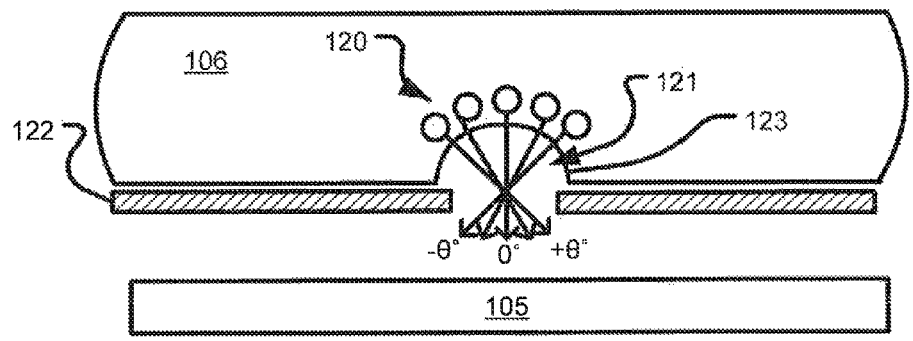
FIG. 3 is a block diagram of a plasma processing apparatus having an insulating modifier.

FIG. 3 is a block diagram of a plasma processing apparatus having an insulating modifier. The plasma 106 is generated as is known in the art and is generally a quasi-neutral collection of positively-charged or negatively-charged molecular or atomic ions and negatively-charged electrons. In a system containing the plasma 106, ions 120 from the plasma 106 are attracted toward a workpiece 105. The plasma 106 is bounded by a region proximate the workpiece 105 referred to as a plasma sheath 121. The plasma sheath 121 is a region that has fewer electrons than the plasma 106. Hence, the differences between the negative and positive charges cause a sheath potential in the plasma sheath 121. The light emission from this plasma sheath 121 is less intense than the plasma 106 because fewer electrons are present and, hence, few excitation-relaxation collisions occur. Thus, the plasma sheath 121 is sometimes referred to as "dark space."

The insulating modifier 122 is configured to modify an electric field within the plasma sheath 121 to control a shape of a boundary 123 between the plasma 106 and the plasma sheath 121. Of course, while an insulator is explicitly disclosed other embodiments may use a semiconductor or conductor. Accordingly, ions 120 that are attracted from the plasma 106 across the plasma sheath 121 may strike the workpiece 105 at a large range of incident angles, such as, for example, between +θ° and −θ° centered around 0°. This insulating modifier 122 may be referred to as, for example, a focusing plate or sheath engineering plate.

Ions 120 may be attracted from the plasma 106 across the plasma sheath 121 by different mechanisms. In one instance, the workpiece 105 is biased to attract ions 120 from the plasma 106 across the plasma sheath 121. In another instance, a plasma source that generates the plasma 106 and walls surrounding the plasma 106 are biased positively and the workpiece 105 may be grounded. The biasing may be pulsed in one particular embodiment In yet another instance, electric or magnetic fields are used to attract ions 120 from the plasma 106 toward the workpiece 105. When the workpiece 105 is biased, for example, the ions 120 are attracted across the plasma sheath 121 through an aperture in the insulating modifier 122.

Use of a pulsed plasma source, such as the source 101 in the plasma doping system 100, the ion source 110, or others, may be used to form polyatomic or molecular ions because electron heating may be controlled. Use of pulsed repetitive excitation will produce at least two periods or phases. First, an electron impact induced ionization and an electron excitation phase when the voltage is applied. Second, the decay phase between the pulses due to heavy particle volume recombination and diffusion. A pulse on period, such as that used to for ionization or electron excitation, may be shorter than a pulse off period. Due to this duration difference between pulse on and pulse off periods, the time-averaged electron temperature may be lower than in a steady-state discharge. Electron temperature is the temperature of a group of electrons that have velocities following the Maxwell-Boltzmann distribution or a percentage of an average energy of such a group of electrons. Electron temperature is higher during pulse on periods and rapidly falls down during pulse off periods. Thus, the average between pulse on and pulse off periods may be lower than some instances where only a pulse on period is used, such as in a steady-state discharge.

The electron kinetics and, therefore, the plasma chemistry may be tailored by modifying plasma parameters. These parameters include power, pressure, temperature, peak voltage, pulse duration, repetition rate, residence time of a particle or ion, and duty cycle. By controlling these parameters, different ion species can be produced within a pulsed period. Such parameters may control an electron energy distribution function (EEDF). These ion species that are formed may be atomic or molecular ions. In one instance, the molecular ions have a larger mass than the gases used to create them. For example, a higher RF power generates lighter or atomic ions while a lower RF power generates heavier or molecular ions. Adjusting the RF power adjusts the electron energy, which modifies the number of collisions, the ions formed, and the potential reactions between ions and neutral particles. In another example, a lower pressure may enable lighter or atomic ions to be formed while by a higher pressure may enable heavier or molecular ions to be formed because there may be a lower electron energy at a higher pressure than a lower pressure.

Figure 4A:
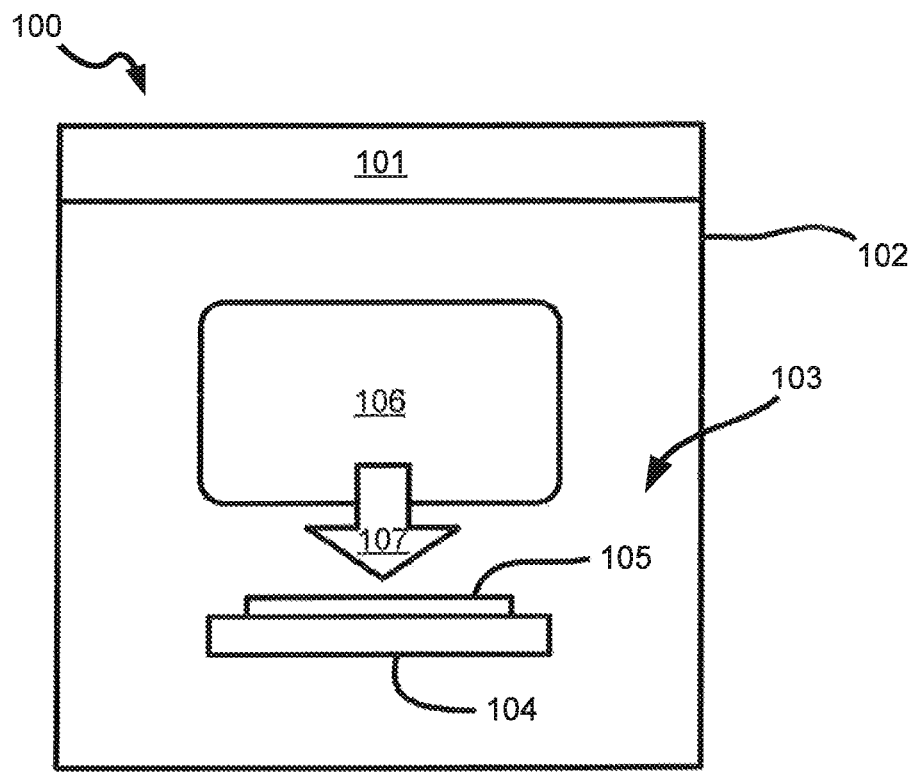
FIG. 4A-B are cross-sectional views of a first embodiment of implantation of multiple ions using a plasma doping system.
Figure 4B:
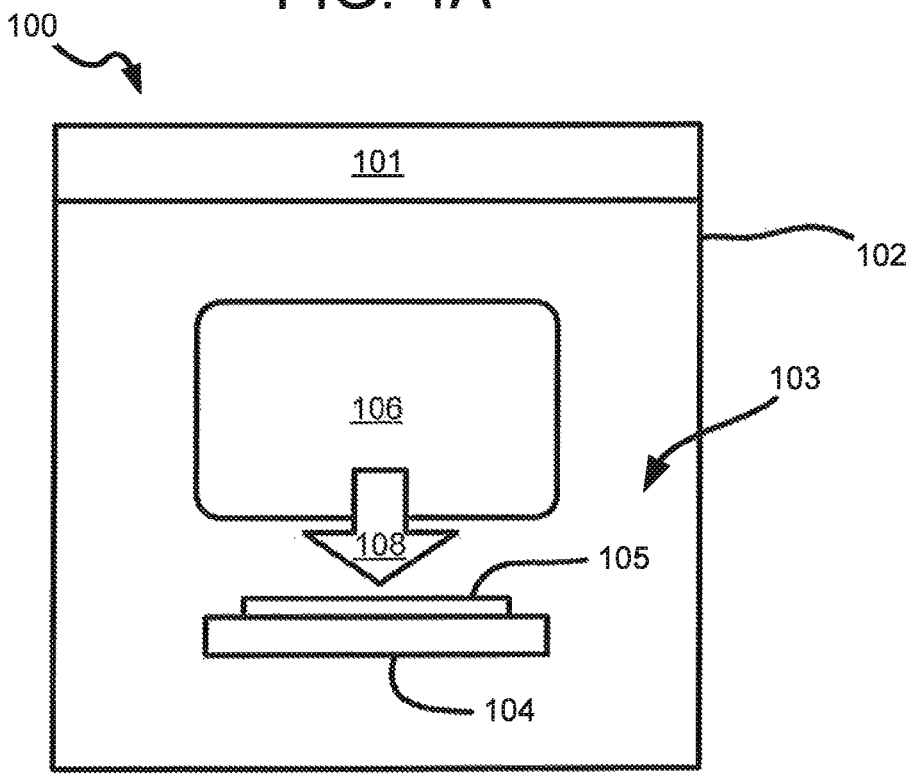

FIGS. 4A-B are cross-sectional views of a first embodiment of implantation of multiple ions using a plasma doping system. While the plasma doping system 100 is illustrated, other ion implanters may be used. The plasma 106 in FIGS. 4A-B may be generated from one or more gases. These gases may be made up of molecules or atoms. The source 101 in one embodiment is an RF source. To have independent control of electron energy distribution function and electron heating processes versus ion flux and ion energy, a MSPRF generator may be used to modulate the power of, for example, the source 101 or other ion sources or plasma generation devices.

At a first time, a first ion species 107 is generated and implanted into the workpiece 105. At a second time, a second ion species 108 is generated and implanted into the workpiece 105. The first ion species 107 and second ion species 108 may be atomic or molecular. Both the first ion species 107 and second ion species 108 may be implanted to different depths, at different energies, or at different doses in the workpiece 105. The process illustrated in FIGS. 4A-B may be repeated multiple times in one instance and may be performed without breaking vacuum. Of course, other embodiments where three or more ion species are generated may be performed.

In one embodiment, the first ion species 107 and second ion species 108 are both molecular ions and at least one is larger than the one or more gases from which the plasma 106 was formed. In this instance, neutral atoms or molecules that are ionized and excited in the plasma 106 react with surrounding neutral and ionic atoms and molecules in the plasma 106 to form molecular ions of a larger mass and various stoichiometries. By adjusting the ratio of the partial pressures of the gases in the plasma 106 and modulating parameters of the plasma 106, molecular ions of a desired stoichiometry may be formed or residence time of particles or ions may be adjusted. For example, at a higher power $CH_x^+$ ions are formed while $P_xH_y$ or $P_xCH_y^+$ ions are formed at a lower power. In one particular embodiment, $CH_x^+$ is formed from $P_xCH_y$ at approximately 2 kW while $P_2H_y^+$ or $P_2CH_y^+$ is formed at between approximately 0 to 500 W.

The temperature of the walls of an ion source or process chamber, such as the process chamber 102, may be controlled during formation of the various ion species. The temperature of the walls affects deposition on the walls or reactions at the walls. This temperature also affects the plasma composition because temperature affects reaction rates within the plasma 106. The walls of the ion source or process chamber, such as the process chamber 102, also may be coated with a catalytic metal. This catalytic metal may be, for example, nickel, platinum, or other materials. The catalytic metal may encourage particular reactions within the plasma 106.

In one specific embodiment, the plasma parameters or electron kinetics are modified in between the periods illustrated in FIG. 4A and FIG. 4B. Thus, the plasma parameters may remain constant during formation of the first ion species 107 and second ion species 108. In another specific embodiment, only the power and bias voltage are modified between FIG. 4A and FIG. 4B once other plasma parameters are selected.

Figure 5:
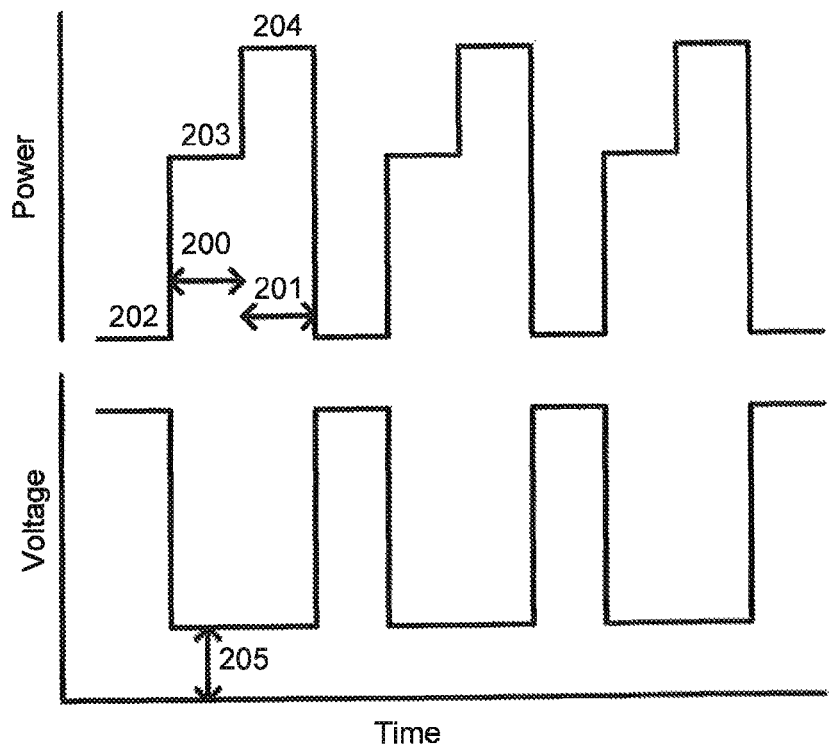
FIG. 5 is a first embodiment of a timing diagram.

FIG. 5 is a first embodiment of a timing diagram. While three repetitions are illustrated, more or fewer may be used. Thus, this concept is not solely limited to the embodiment illustrated in FIG. 5. The top line represents source power level, such as to the source 101 illustrated in FIG. 1 or other ion sources. This source 101 may be an RF source. The bottom line is the voltage. This voltage may be bias voltage to a platen 104 or workpiece 105 illustrated in FIG. 1, but also may be an extraction voltage in a beam-line ion implanter or a flood ion implanter. Thus, the bias voltage is related to energy of the ions that are formed and, consequently, the depth these ions are implanted.

The source power has three settings in this embodiment. A first source power 202 is less than a second source power 203. The second source power 203 is less than the third source power 204. The first source power 202 may be greater than or equal to zero. The second source power 203 lasts for a first time period 200. The third source power 204 lasts for a second time period 201. In this embodiment, the first time period 200 and second time period 201 combined are the length of the voltage at a first voltage 205. Thus, the second source power 203 and third source power 204 are synchronized with the bias pulse. The bias voltage at a first voltage 205 defines the energy of the molecular and atomic ions implanted into a workpiece.

In a first embodiment, a molecular ion is formed at the second source power 203 and an atomic ion is formed at the third source power 204. This may be at least partly because molecules may be broken apart at a higher source power. In a second embodiment, a molecular ion is formed at both the second source power 203 and the third source power 204 because the source powers may be adjusted to enable the formation of two molecular ions. These two molecular ions may have different formulas and molecular weights. In one particular embodiment, the source power is between approximately 100 W and 5 kW and the bias voltage is between approximately 100 V and 30 kV. Of course, since only a first voltage 205 is used, the ions are implanted at a single energy instead of two different energies. Different implant depths may be obtained due to differences in the size of the various ions that are formed.

Figure 6:
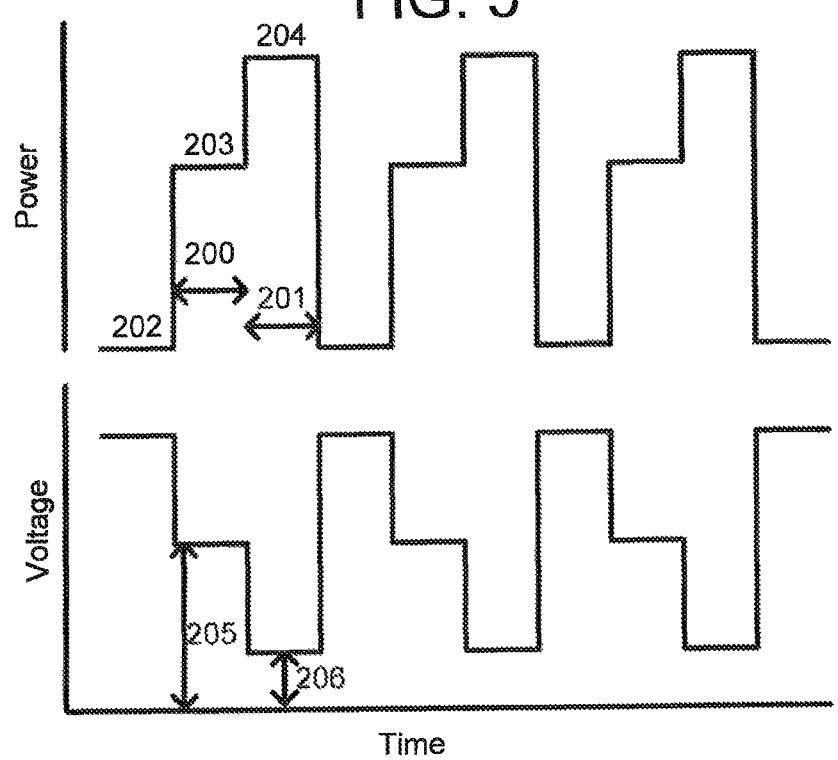
FIG. 6 is a second embodiment of a timing diagram.

FIG. 6 is a second embodiment of a timing diagram. In this embodiment, there is a first voltage 205 and second voltage 206. The first voltage 205 corresponds to the second source power 203. The second voltage 206 corresponds to the third source power 204. The first voltage 205 and second voltage 206 are different. In a first embodiment, a molecular ion is formed at the second source power 203 and an atomic ion is formed at the third source power 204. Use of the first voltage 205 and second voltage 206 enables a molecular ion and atomic ion to be implanted at two different energies. Thus, the molecular ion and atomic ion may be implanted at two different depths. Of course, two molecular ions also may be implanted at two different depths in an alternate embodiment.

Figure 7:
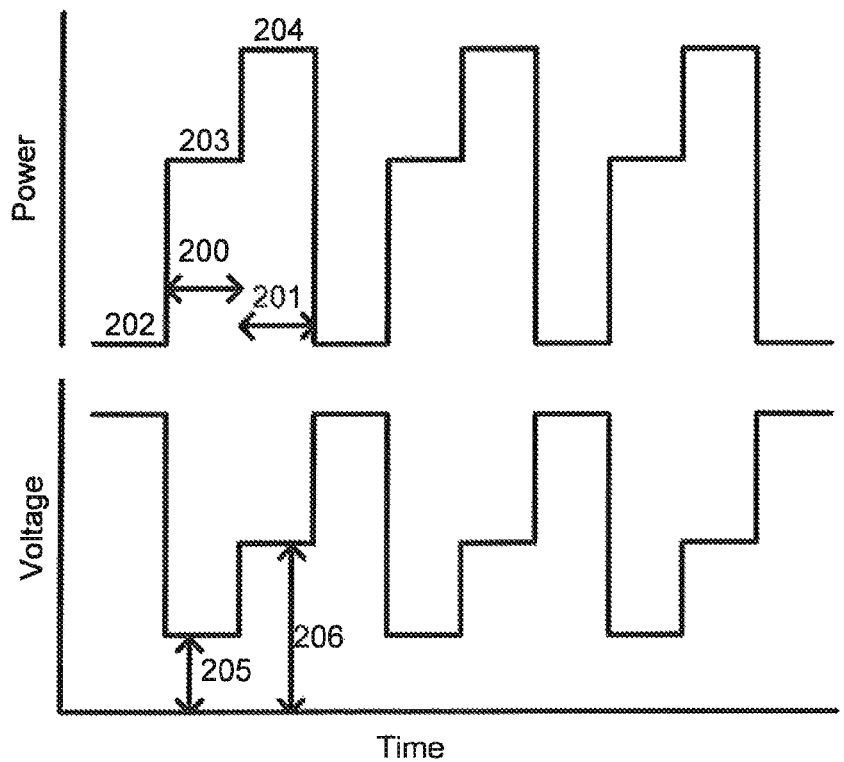
FIG. 7 is a third embodiment of a timing diagram.

FIG. 7 is a third embodiment of a timing diagram. In this particular embodiment, the first voltage 205 corresponds to the second source power 203 and the second voltage 206 corresponds to the third source power 204. The first voltage 205 and second voltage 206 are different and opposite of the scheme illustrated in FIG. 6. Use of the first voltage 205 and second voltage 206 enables a molecular ion and atomic ion to be implanted at two different energies. Thus, the molecular ion and atomic ion may be implanted at two different depths. Of course, two molecular ions also may be implanted at two different depths in an alternate embodiment.

Figure 8:
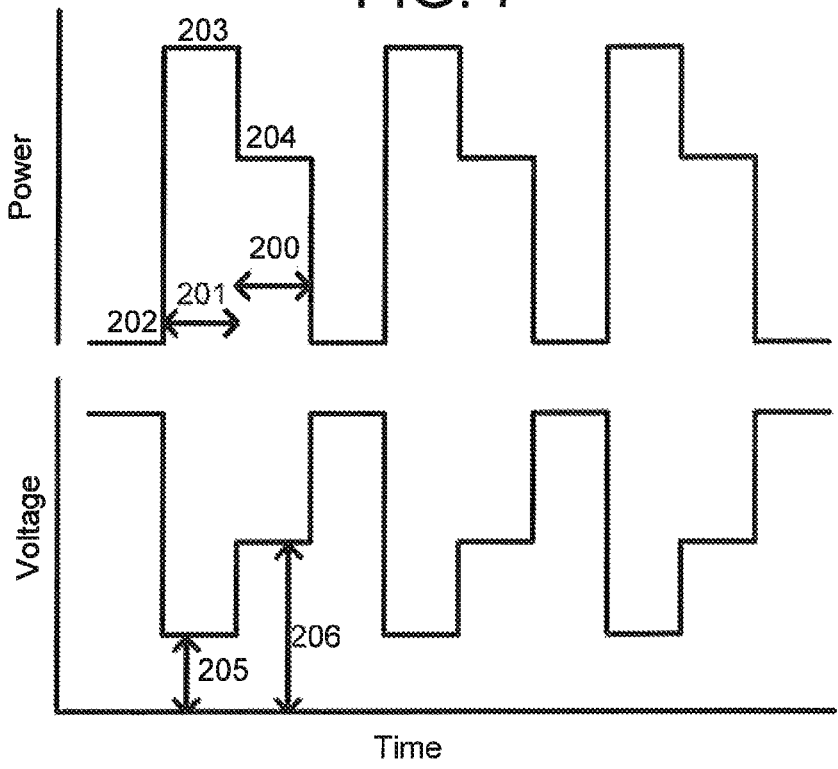
FIG. 8 is a fourth embodiment of a timing diagram.

FIG. 8 is a fourth embodiment of a timing diagram. This has a second source power 203 larger than the third source power 204. Use of the first voltage 205 and second voltage 206 enables the molecular ion and atomic ion to be implanted at two different energies. Thus, the molecular ion and atomic ion may be implanted at two different depths. Of course, two molecular ions also may be implanted at two different depths in an alternate embodiment.

Figure 9:
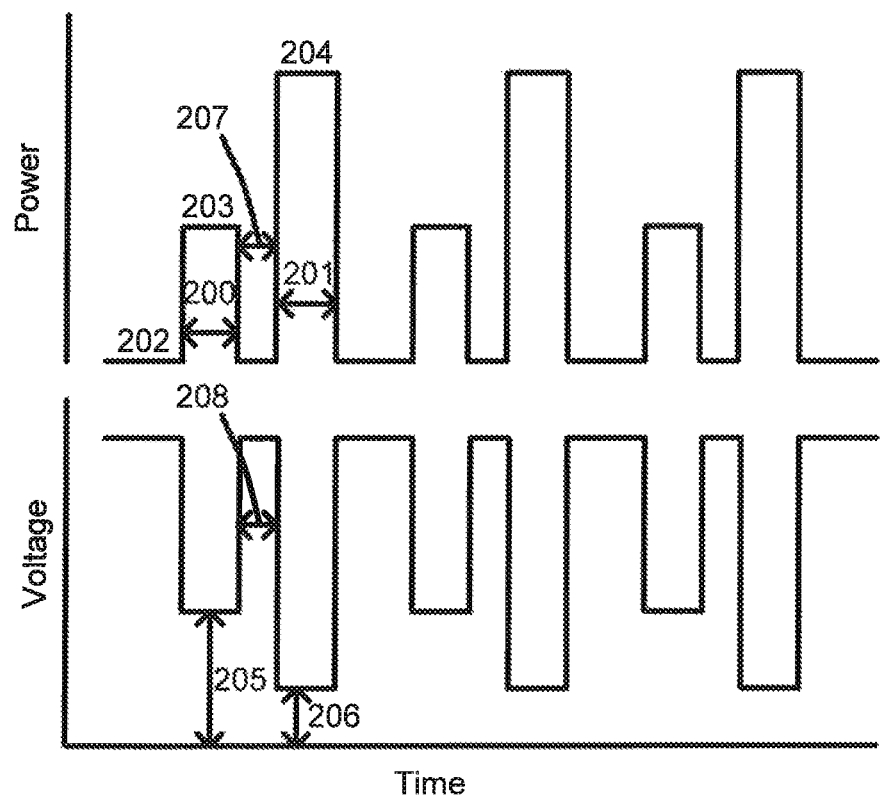
FIG. 9 is a fifth embodiment of a timing diagram.

FIG. 9 is a fifth embodiment of a timing diagram. In this particular embodiment, there is a period of time 207 between the first time period 200 at the second source power 203 and the second time period 201 at the third source power 204. There is a period of time 208 between the first voltage 205 and second voltage 206 that corresponds with the period of time 207. In this particular embodiment, the period of time 207 and period of time 208 are substantially the same.

Of course, the third source power 204 may be smaller than the second source power 203 in the embodiments illustrated herein. The third source power 204 is illustrated as larger than the second source power 203 in FIGS. 5-7 and 9 for simplicity. Other power settings or voltages may be included to generate or implant other atomic or molecular ions. The duration or magnitudes of the first voltage 205 and second voltage 206, the bias pulse width, or the various source power settings may be changed to adjust the dose or dose rate of the ions implanted into a workpiece. For example, the duty cycle may be between approximately 5% and 50%. Thus, the concepts disclosed herein are not limited solely to the embodiments illustrated in FIGS. 5-9.

Formation of molecular ions may be optimized in one instance. Electron kinetics or an EEDF is controlled to form the ions. At least one of power, peak voltage, pulse duration, duty cycle, pressure, gas flow, residence time, and temperature are controlled during this optimization. Controlling particular collisions in the plasma, gas composition used to form the plasma, temperature of the gas used to form the plasma, electric fields, or mass of the gases used to form the plasma also may affect electron kinetics and may be controlled. Other parameters known to those skilled in the art also may be controlled. In one specific embodiment, $CH_4$ was a first gas and $PH_3$ was a second gas. Both the first gas and second gas were used to form a plasma. Heavier molecular ions were generated in this plasma. Specifically, $C_2PH_x^+$ and $CP_2H_x^+$ ions were formed, wherein x is an integer. Thus, the molecular ions formed were larger than the gases used to generate the plasma. The partial pressures of the $CH_4$ and $PH_3$ were adjusted to enable production of molecular ions. Flowing 50% $PH_3$ produced more molecular ions than flowing 20% $PH_3$ at a specific set of plasma parameters.

Figure 10:
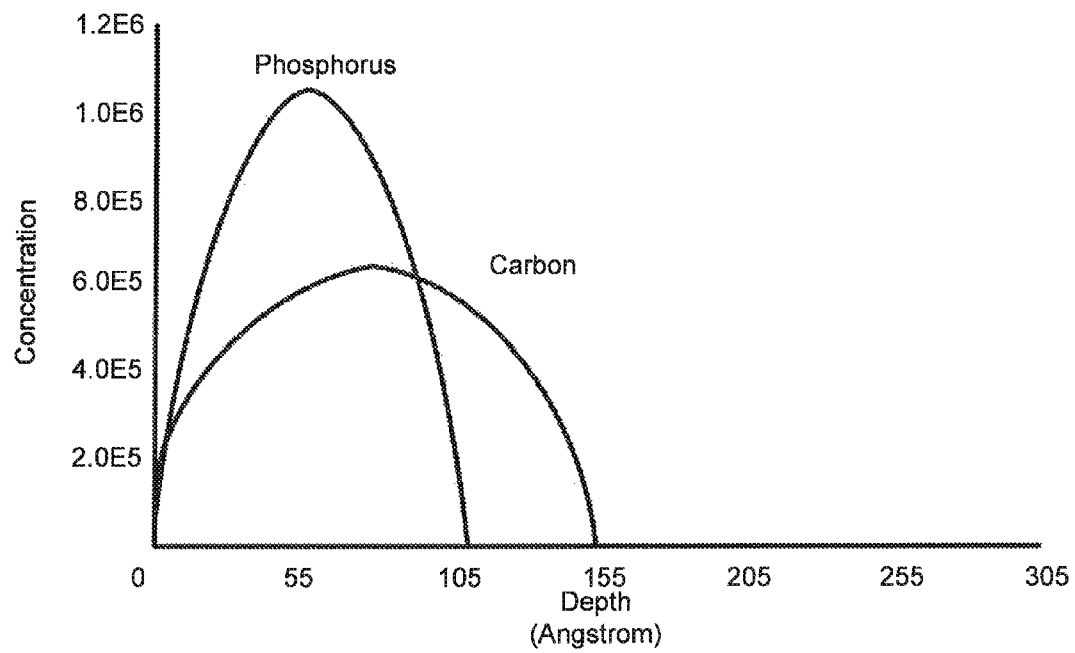
FIG. 10 is an exemplary dopant profile for carbon and phosphorus.

FIG. 10 is an exemplary dopant profile for carbon and phosphorus. Carbon and phosphorus were implanted into a silicon workpiece using a $C_2PH_x^+$ molecular ion implanted at 5 keV. Molecular ions share total energy among constituent atoms in the molecule according to the respective masses of each. As seen in FIG. 10, the phosphorus peak is shallower than the carbon peak. In the embodiment of FIG. 10, the carbon and phosphorus were implanted at the same energy.

Figure 11:
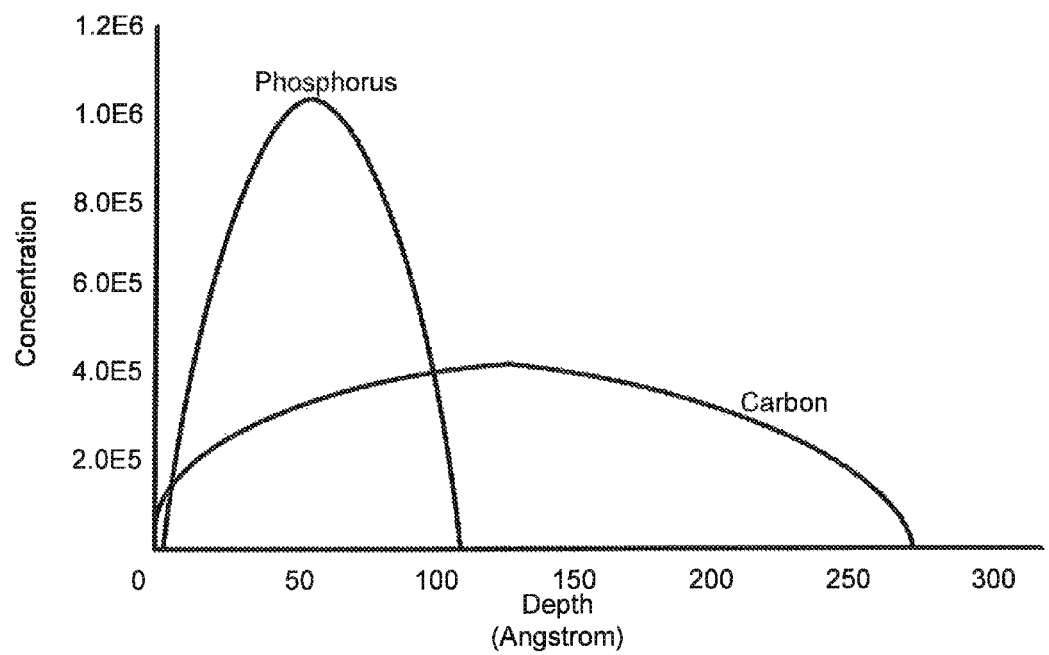
FIG. 11 is an exemplary dopant profile for carbon and phosphorus using an embodiment disclosed herein.

FIG. 11 is an exemplary dopant profile for carbon and phosphorus using an embodiment disclosed herein. Carbon was implanted at 8 keV and phosphorus was implanted at 5 keV. As seen in FIG. 11, the phosphorus peak is shallower than the carbon peak. By implanting at different energies through changing the voltage, ions can reach a greater depth in the workpiece. Thus, implanting at different energies may be used to tailor implant depths to suit particular applications.

The gases supplied to form the plasma may be, for example, $CH_4$, $C_2H_4$, another alkane of the formula $C_xH_y$, another hydrocarbon, $B_2H_6$, $CO_2$, $C_2F_4$, $BF_3$, $AsH_3$, $PH_3$, $GeH_4$, $GeF_4$, $PI_3$, $AsI_3$, $N_2$, $NH_3$, $P_xH_y$, $C_xF_y$, $Al_xCl_y$, $Ge_xH_y$, or $Ge_xF_y$, other organometallic molecules known to those skilled in the art, or other species known to those skilled in the art. In these examples, x and y are integers greater than one. Examples of possible atomic ions that may be formed include P, B, As, C, He, Ar, H, Ge, and Si. Some potential combinations of atomic ions include P and C, B and C, He and Ar, As and C, P and H, Ge and C, Ge and B, Ge and Si, and B and C. Examples of possible molecular ions that may be formed include $C_xH_y$, $B_xH_y$, $B_xF_y$, $B_xN_y$, $As_xH_y$, $As_xF_y$, $As_xN_y$, $P_xH_y$, $P_xF_y$, $P_xN_y$, $C_xF_y$, $C_xN_y$, $Al_xCl_y$, $Al_xH_y$, $Al_xF_y$, $Ge_xH_y$, $Ge_xF_y$, or $Ge_xN_y$ wherein x and y are integers greater than zero. These molecular ions may have a larger atomic mass than the gases from which the molecular ions are formed. The molecular ions generated also may be, for example, $P_xC_yH_z$, $P_xC_yF_z$, $P_xC_yN_z$, $B_xC_yH_z$, $B_xC_yF_z$, $B_xC_yN_z$, $As_xC_yH_z$, $As_xC_yF_z$, $As_xC_yN_z$, $Ge_xC_yH_z$, $Ge_xC_yF_z$, $Ge_xC_yN_z$, $Al_xC_yH_z$, $Al_xC_yF_z$, $Al_xC_yCl_z$, $Al_xP_yH_z$, or other molecular ions known to those skilled in the art wherein x is an integer greater than one and at least one of y and z are integers greater than one. Other molecular ions also may be formed combining a metal with carbon, boron, or phosphorus or using zinc or gallium. These listed formulas for the molecular ions may vary as known to those skilled in the art, wherein, for example, the listed $B_xC_yH_z$ includes $C_xB_yH_z$. In one particular instance, $P_xC_y$ is formed wherein x is between 1 and 20 and y is greater than or equal to zero. Of course, one skilled in the art will recognize that many other molecular or atomic ions may be formed for implantation into a workpiece. This list is merely exemplary.

The ions that are formed may be used for multiple applications. These include doping of a workpiece, strain modification of a workpiece, or other material modification of the workpiece. This material modification may include, for example, amorphization or damage engineering of a workpiece or transient-enhanced diffusion (TED) control. The ions also may be used for ultra-shallow junctions (USJ), to manufacture low k dielectrics, to fabricate optical coatings, defect engineering, SiGe applications, forming a defect layer to cleave a workpiece, or for implanting workpieces having three-dimensional surface structures.

In one specific embodiment, $C^+$ and $B^+$ or $C^+$ and $P^+$ are implanted to different depths. The $C^+$ is implanted deeper than the $B^+$ or $P^+$ to enable TED control. In one particular example, $CH_x^+$ and $P_xH_y^+$ are implanted to two different depths. In another particular example, $CH_x^+$ and $P_xC_yH_z^+$ are implanted to two different depths.

Figure 12A:
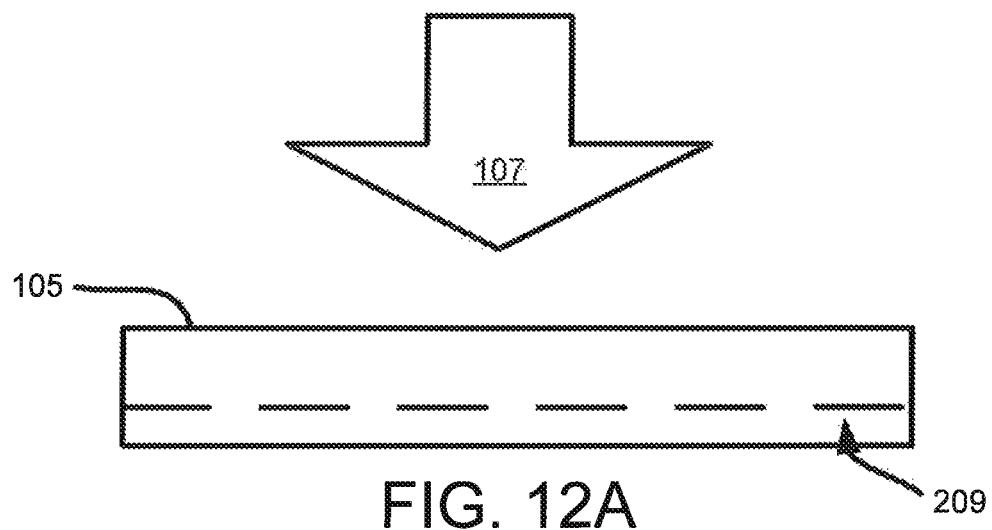
FIGS. 12A-B are cross-sectional views of a first embodiment of implanting to different depths.
Figure 12B:
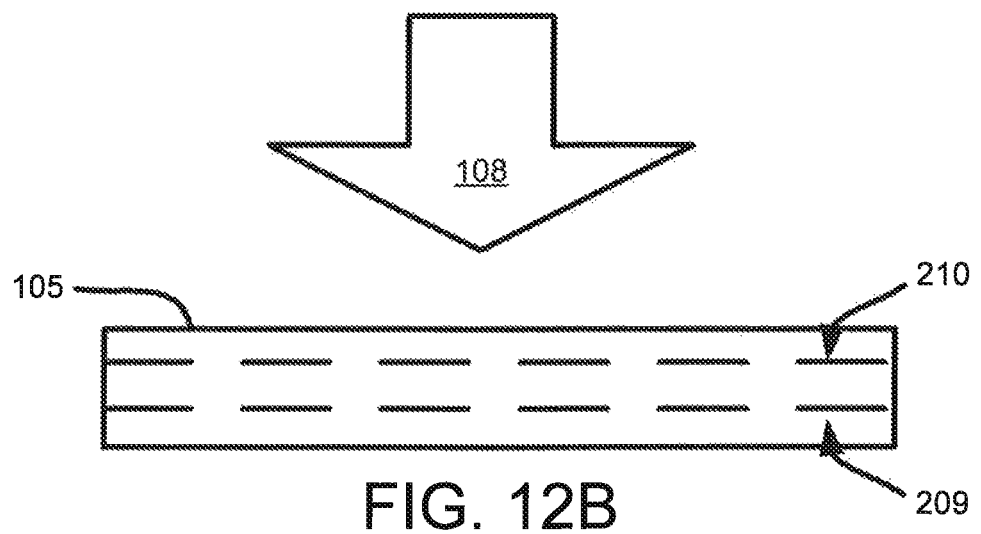

FIGS. 12A-B are cross-sectional views of a first embodiment of implanting to different depths. In FIG. 12A, the first ion species 107 is $C^+$ or $CH_x^+$. The first ion species 107 is implanted to a first depth 209 in the workpiece 105 (represented by the dotted line). Then the second ion species 108, which may be, for example, $P_xH_y^+$ or $B_xH_y^+$, is implanted to a second depth 210 (also represented by a dotted line). This second depth 210 is shallower than or not as deep as the first depth 209. Thus, the first ion species 107 and second ion species 108 are implanted at two different energies. Of course, other ion species may benefit from implantation at two different energies and the embodiment illustrated in FIGS. 12A-B is meant to be exemplary.

In one particular embodiment, the workpiece 105 is heated or cooled during implant. In one instance, the workpiece 105 is heated and damage from the implant is at least partially annealed during the implant. Heating or cooling the workpiece 105 affects amorphization which in turn partially affects dopant distribution from the first ion species 107 and the second ion species 108. Thus, heating or cooling may affect the depth of any implants using embodiments disclosed herein.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method to generate ions comprising:
flowing a gas into a plasma chamber;
forming a plasma from said gas in said plasma chamber using at least a first power to an ion source and a second power to said ion source;
generating a first ion species at said first power and a second ion species at said second power, said first ion species and said second ion species being generated from said gas, wherein Said first ion species and said second ion species are each a molecular ion larger than said gas and wherein said first ion species and said second ion species each have a different formula; and
implanting said first ion species and said second ion species into a workpiece, disposed in said plasma chamber, at two different energies using at least a first bias voltage and a second bias voltage, said first bias voltage applied to said workpiece while said first ion species are being generated at said first power, said second bias voltage applied to said workpiece while said second ion species are being generated at said second power, wherein said first bias voltage is different than said second bias voltage, such that said first ion species and said second ion species implant said workpiece at two different depths.

2. The method of claim 1, further comprising flowing a second gas into said plasma chamber with said gas.

3. The method of claim 1, further comprising optimizing said forming of said plasma to control electron kinetics to form said first ion species and said second ion species, wherein said optimizing comprises controlling at least one of power, peak voltage, pulse duration, duty cycle, pressure, gas flow, residence time, and temperature.

4. The method of claim 1, wherein said first ion and said second ion are selected from the group consisting of $P_xH_y$, $P_xC_y$, $B_xH_y$, $B_xC_y$, $C_xP_yH_z$, and $C_xB_yH_z$, wherein x, y, and z are integers greater than or equal to 1.

5. The method of claim 1, wherein said ion source comprises an RF ion source.

6. A method to generate molecular ions comprising:
flowing a first gas and a second gas into a plasma chamber;
forming a plasma from said first gas and said second gas in said plasma chamber;
generating a first molecular ion and a second molecular ion from said first gas and said second gas using two different power levels of an ion source, wherein said first molecular ion and said second molecular ions are each larger than said first gas and said second gas and said first molecular ion and said second molecular ions have different formulas, wherein said first molecular ion is generated during a first power level and said second molecular ion is generated during a second power level; and
implanting said first molecular ion and said second molecular ion into a workpiece, disposed in said plasma chamber, at two different energies, by applying a first bias voltage to said workpiece while said first molecular ion is being generated and applying a second bias voltage to said workpiece while said second molecular ion is being generated.

7. The method of claim 6, wherein said first molecular ion and said second molecular ion are selected from the group consisting of $P_xH_y$, $P_xC_y$, $B_xH_y$, $B_xC_y$, $C_xP_yH_z$, and $C_xB_yH_z$, wherein x, y, and z are integers greater than or equal to 1.

8. The method of claim 6, further comprising optimizing said forming of said plasma to control electron kinetics to form said first molecular ion and said second molecular ion, wherein said optimizing comprises controlling at least one of power, peak voltage, pulse duration, duty cycle, pressure, gas flow, residence time, and temperature.

9. The method of claim 6, wherein said first molecular ion and said second molecular ion implant said workpiece at two different depths.

10. The method of claim 6, wherein said ion source comprises an RF ion source.

11. A method to generate ions comprising:
flowing a first molecular gas into a plasma chamber;
forming a plasma from said first molecular gas in said plasma chamber with a first power and a second power applied to an ion source, wherein said second power is greater than said first power;
generating a first ion and a second ion from said first molecular gas, wherein said first ion is generated at said first power and said second ion is generated at said second power, wherein said first ion and said ion are each a molecular ion larger than said first molecular gas, and wherein said first ion and said second ion have different formulas; and implanting said first ion and said second ion into a workpiece disposed in said plasma chamber, at two different energies using a first bias voltage and a second bias voltage, said first bias voltage applied to said workpiece while said first ion is being generated at said first power, said second bias voltage applied to said workpiece while said second ion is being generated at said second power, wherein said first bias voltage is different than said second bias voltage.

12. The method of claim 11, further comprising flowing a second molecular gas into said plasma chamber with said first molecular gas.

13. The method of claim 11, further comprising optimizing said forming of said plasma to control electron kinetics to form said first ion and said second ion, wherein said optimizing comprises controlling at least one of power, peak voltage, pulse duration, duty cycle, pressure, gas flow, residence time, and temperature.

14. The method of claim 11, wherein said implanting is at two different energies and wherein said first ion and said second ion are implanted into said workpiece at two different depths.

15. The method of claim 11, wherein said first ion and said second ion are selected from the group consisting of $P_xH_y$, $P_xC_y$, $B_xH_y$, $B_xC_y$, $C_xP_yH_z$, and $C_xB_yH_z$, wherein x, y, and z are integers greater than or equal to 1.

16. The method of claim 11, wherein said ion source comprises an RF ion source.

* * * * *